(12) United States Patent
Agarwal et al.

(10) Patent No.: US 9,960,052 B2
(45) Date of Patent: May 1, 2018

(54) METHODS FOR ETCHING A METAL LAYER TO FORM AN INTERCONNECTION STRUCTURE FOR SEMICONDUCTOR APPLICATIONS

(71) Applicant: Applied Materials, Inc., Santa Clara, CA (US)

(72) Inventors: Sumit Agarwal, Dublin, CA (US); Ann Chien, Pleasanton, CA (US); Chiu-Pien Kuo, Zhubei (TW); Mark Hoinkis, Fishkill, NY (US); Bradley J. Howard, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 14/243,677

(22) Filed: Apr. 2, 2014

(65) Prior Publication Data
US 2015/0287634 A1    Oct. 8, 2015

(51) Int. Cl.
*H01L 21/3213* (2006.01)
*H01J 37/32* (2006.01)
*H01L 21/768* (2006.01)

(52) U.S. Cl.
CPC .. *H01L 21/32136* (2013.01); *H01L 21/32139* (2013.01); *H01J 37/321* (2013.01); *H01J 2237/334* (2013.01); *H01L 21/7682* (2013.01); *H01L 21/76885* (2013.01)

(58) Field of Classification Search
CPC .................. H01L 21/67225; H01L 31/206
See application file for complete search history.

(56) References Cited

U.S. PATENT DOCUMENTS

| | | | |
|---|---|---|---|
| 6,300,202 B1 | 10/2001 | Hobbs et al. | |
| 6,319,730 B1 | 11/2001 | Ramdani et al. | |
| 6,323,143 B1 | 11/2001 | Yu | |
| 6,326,261 B1 | 12/2001 | Tsang et al. | |
| 6,348,386 B1 | 2/2002 | Gilmer | |
| 6,855,643 B2 | 2/2005 | Nallan et al. | |
| 2012/0164839 A1* | 6/2012 | Nishimura | C23F 4/00 438/720 |

* cited by examiner

*Primary Examiner* — Mohammad Choudhry
(74) *Attorney, Agent, or Firm* — Patterson + Sheridan, LLP

(57) ABSTRACT

Embodiments of the present invention provide methods for patterning a metal layer, such as a copper layer, to form an interconnection structure in semiconductor devices. In one embodiment, a method of patterning a metal layer on a substrate includes (a) supplying an etching gas mixture comprising a hydro-carbon gas into a processing chamber having a substrate disposed therein, the substrate having a metal layer disposed thereon, (b) exposing the metal layer to an ashing gas mixture comprising a hydrogen containing gas to the substrate, and (c) repeatedly performing steps (a) and (b) until desired features are formed in the metal layer. During the patterning process, the substrate temperature may be controlled at greater than 50 degrees Celsius.

16 Claims, 4 Drawing Sheets

METHODS FOR ETCHING A METAL LAYER TO FORM AN INTERCONNECTION STRUCTURE FOR SEMICONDUCTOR APPLICATIONS

BACKGROUND

1. Field

Embodiments of the present invention generally relate to methods of patterning a metal layer, and more particularly to methods of patterning a copper material utilized to form interconnection structures in semiconductor applications.

2. Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-50 nm scale, it is necessary to use low resistivity conductive materials (e.g., copper) as well as low dielectric constant insulating materials (dielectric constant less than about 4) to obtain suitable electrical performance from such components.

The demands for greater integrated circuit densities also impose demands on the process sequences used in the manufacture of integrated circuit components. As the physical dimensions of the structures used to form semiconductor devices are pushed against technology limits, the process of accurate pattern transfer for structures that have small critical dimensions and high aspect ratios has become increasingly difficult. Copper is commonly used to form interconnects a sub-micron device nodes due to its low resistivity compared to aluminum. Copper interconnects are electrically isolated from each other by an insulating material. When the distance between adjacent metal interconnects and/or thickness of the insulating material has sub-micron dimensions, capacitive coupling may potentially occur between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g. dielectric constants less than about 4.0) are needed.

Copper interconnect system are typically fabricated using a damascene process in which trenches and vias are etched into dielectric layers. The trenches and vias are filled with copper, which is then planarized using, for example, a chemical-mechanical planarization (CMP) process. However, several disadvantages associated with copper damascene structure have become severe concerns as feature sizes continue to decrease. For example, small feature size of the metal lines generally requires higher aspect ratios, which adversely increases the difficulty in filling such features to form void free metal structures. Forming a barrier layer within high aspect features is particularly difficult. Furthermore, as feature sizes continue to decrease, the barrier layer cannot scale, thus resulting in the barrier layer becoming a greater fraction of that particular feature. Additionally, as the feature dimensions become comparable to the bulk mean free path, the effective resistivity of copper features will increase because of non-negligible electron scattering at the copper-barrier interface and at grain boundaries.

Accordingly, an alternate metal patterning using subtractive metal etching process has recently gained wide attention. A dry plasma etching process is performed to pattern the metal materials to form one or more patterns in the interconnect structure. However, current dry plasma etching processes are primarily performed by physical sputtering which results in low selectivity between the metal layer and the hardmask layer utilized during the etching process. Furthermore, by-products generated during the dry plasma etching process are redeposited on the sidewalls, resulting in tapered profiles and line width increase.

Thus, there is a need for improved methods for patterning a metal line, especially a copper layer, in an interconnection structure with improved process control to form accurate and desired interconnection structures for semiconductor devices.

SUMMARY

Embodiments of the present invention provide methods for patterning a metal layer, such as a copper layer, to form an interconnection structure in semiconductor devices. In one embodiment, a method of patterning a metal layer on a substrate includes (a) supplying an etching gas mixture comprising a hydro-carbon gas into a processing chamber having a substrate disposed therein, the substrate having a metal layer disposed thereon, (b) exposing the metal layer to an ashing gas mixture comprising a hydrogen containing gas to the substrate, and (c) repeatedly performing steps (a) and (b) until desired features are formed in the metal layer.

In another embodiment, a method of patterning a metal layer on a substrate includes (a) performing an etching process comprising a hydro-carbon plasma on a metal layer disposed on a substrate in a processing chamber, (b) performing an ashing process comprising a hydrogen plasma on the metal layer, and (c) repeatedly performing steps (a) and (b) until desired features are formed in the metal layer.

In yet another embodiment, a method of patterning a metal layer on a substrate includes supplying an etching gas mixture including methane ($CH_4$) to a processing chamber having a substrate disposed therein, the substrate having a metal layer disposed thereon, etching a portion of the metal layer from the substrate, exposing the metal layer to an ashing gas mixture comprising a hydrogen gas to the substrate, removing etching byproducts from the substrate, and cyclically supplying the etching gas mixture and the ashing gas mixture to the processing chamber until desired features are formed in the metal layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for patterning a metal layer on a substrate to form features in the metal layer for interconnection structure manufacturing for semiconductor devices. In one embodiment, the patterning process is a dry etching process that utilizes a cyclic etching process to incrementally etch the metal layer as well as removing etching by-products generated during the etching process. The cyclical etching process may timely remove etching by-product so as to provide an accurate control of etching selectivity and to provide a good profile control of the features formed in the metal layer. In one embodiment, the etching process may be utilized to form features, trenches, or vias in a metal for an interconnection structure for semiconductor devices.

Figure 1:
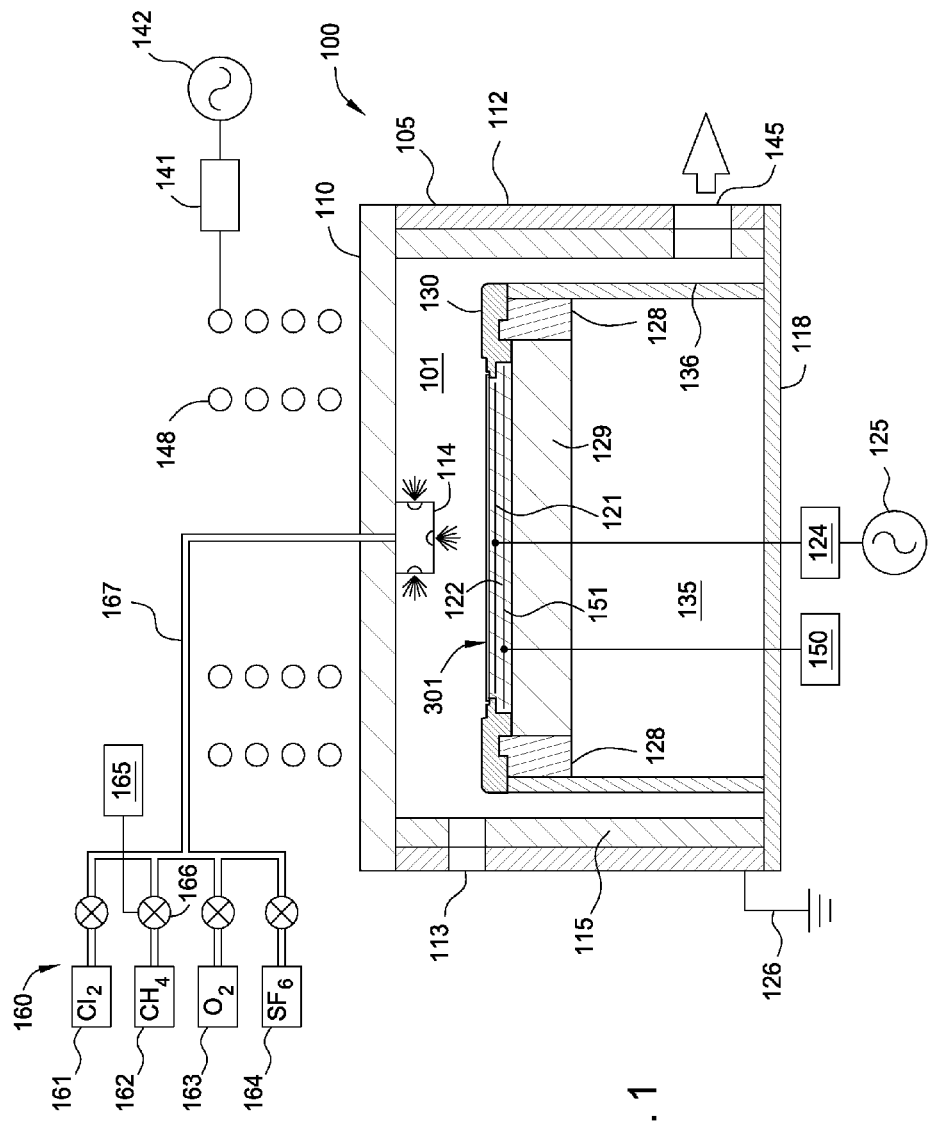
FIG. 1 depicts an apparatus utilized to pattern a metal layer formed on a substrate to manufacture an interconnection structure in accordance with one embodiment of the present invention.

FIG. 1 is a simplified cutaway view for an exemplary etching processing chamber 100 for etching a metal layer. The exemplary etching processing chamber 100 is suitable for removing one or more film layers from the substrate 301. One example of the process chamber that may be adapted to benefit from the invention is an AdvantEdge Mesa Etch processing chamber, available from Applied Materials, Inc., located in Santa Clara, Calif. It is contemplated that other process chambers, including those from other manufactures, may be adapted to practice embodiments of the invention.

The etching processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the etching processing chamber 100. The dimensions of the chamber body 105 and related components of the etching processing chamber 100 are not limited and generally are proportionally larger than the size of the substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the etching processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen (N2), helium (He) and oxygen gas ($O_2$). Additionally, process gasses may include chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the etching processing chamber 100, the gases are energized to form plasma. An antenna 148, such as one or more inductor coils, may be provided adjacent to the etch processing chamber 100. An antenna power supply 142 may power the antenna 148 through a match circuit 141 to inductively couple energy, such as RF energy, to the process gas to maintain a plasma formed from the process gas in the chamber volume 101 of the etch processing chamber 100. Alternatively, or in addition to the antenna power supply 142, process electrodes below the substrate 301 and/or above the substrate 301 may be used to capacitively couple RF power to the process gases to maintain the plasma within the chamber volume 101. The operation of the power supply 142 may be controlled by a controller, such as controller 165, that also controls the operation of other components in the etching processing chamber 100.

A substrate support pedestal 135 is disposed in the chamber volume 101 to support the substrate 301 during processing. The support pedestal 135 may include an electro-static chuck 122 for holding the substrate 301 during processing. The electro-static chuck (ESC) 122 uses the electro-static attraction to hold the substrate 301 to the substrate support pedestal 135. The ESC 122 is powered by an RF power supply 125 integrated with a match circuit 124. The ESC 122 comprises an electrode 121 embedded within a dielectric body. The RF power supply 125 may provide a RF chucking voltage of about 200 volts to about 2000 volts to the electrode 121. The RF power supply 125 may also include a system controller for controlling the operation of the electrode 121 by directing a DC current to the electrode 121 for chucking and de-chucking the substrate 301.

The ESC 122 may also include an electrode 151 deposed therein. The electrode 151 is coupled to a power source 150 and provides a bias which attracts plasma ions, formed by the process gases in the chamber volume 101, to the ESC 122 and substrate 301 positioned thereon. The power source 150 may cycle on and off, or pulse, during processing of the substrate 301. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing etching processing chamber 100.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 301 disposed thereon. The ESC 122 is configured to perform in the temperature range required by the thermal budget of the device being fabricated on the substrate 301. For example, the ESC 122 may be configured to maintain the substrate 301 at a temperature of about minus about 25 degrees Celsius to about 500 degrees Celsius for certain embodiments.

The cooling base 129 is provided to assist in controlling the temperature of the substrate 301. To mitigate process drift and time, the temperature of the substrate 301 may be maintained substantially constant by the cooling base 129 throughout the time the substrate 301 is in the etch chamber. In one embodiment, the temperature of the substrate 301 is maintained throughout subsequent etch processes at about 70 to 90 degrees Celsius.

A cover ring 130 is disposed on the ESC 122 and along the periphery of the substrate support pedestal 135. The cover ring 130 is configured to confine etching gases to a desired portion of the exposed top surface of the substrate 301, while shielding the top surface of the substrate support pedestal 135 from the plasma environment inside the etching processing chamber 100. Lift pins (not shown) are selectively moved through the substrate support pedestal 135 to lift the substrate 301 above the substrate support pedestal 135 to facilitate access to the substrate 301 by a transfer robot (not shown) or other suitable transfer mechanism.

The controller 165 may be utilized to control the process sequence, regulating the gas flows from the gas panel 160 into the etching processing chamber 100 and other process parameters. Software routines, when executed by the CPU, transform the CPU into a specific purpose computer (controller) that controls the etching processing chamber 100 such that the processes are performed in accordance with the present invention. The software routines may also be stored and/or executed by a second controller (not shown) that is collocated with the etching processing chamber 100.

The substrate 301 has various film layers disposed thereon which may include at least one metal layer. The various film layers may require etch recipes which are unique for the different compositions of the other film layers in the substrate 301. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 100 is configured to at least etch a metal layer to form an interconnection structure. For processing parameters provided herein, the etching processing chamber 100 is configured to process a 300 diameter substrate, i.e., a substrate having a plan area of about 0.0707 $m^2$. The process parameters, such as flow and power, may generally be scaled proportionally with the change in the chamber volume or substrate plan area.

Figure 2:
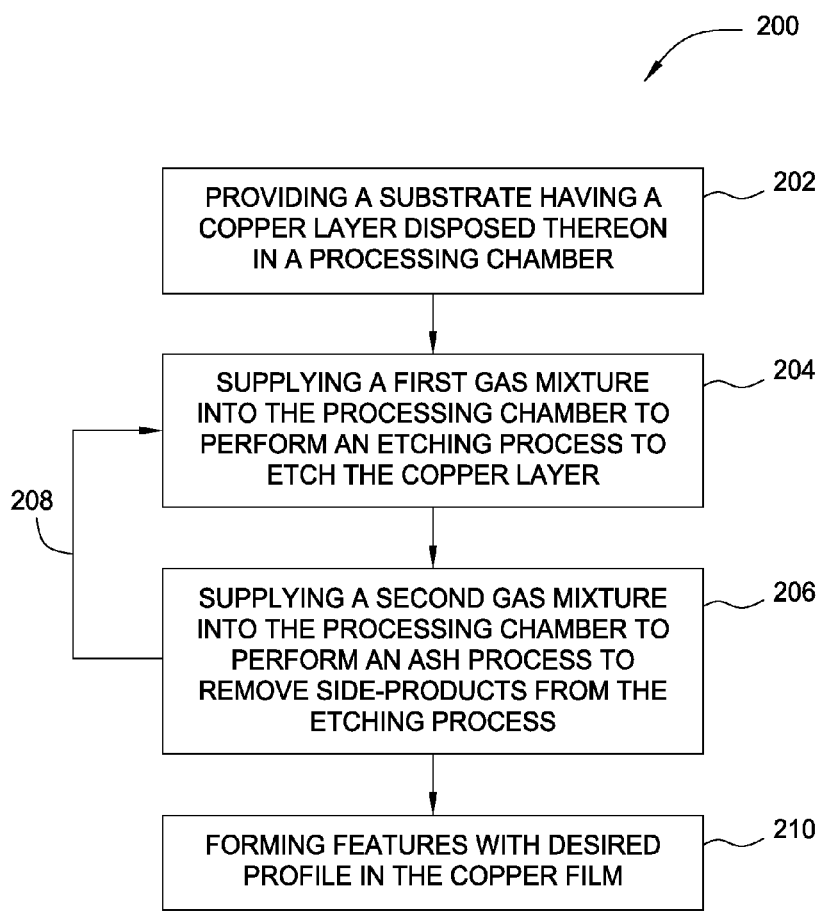
FIG. 2 depicts a flow diagram of a method for patterning a metal layer to form features into the metal layer to manufacture an interconnection structure in accordance with one embodiment of the present invention.

FIG. 2 is a flow diagram of one embodiment of a method 200 for etching a metal layer, such as a copper layer, for manufacturing an interconnection structure for semiconductor devices. The etching process may be performed in a processing chamber, such as the processing chamber 100 depicted in FIG. 1. FIGS. 3A-3D are schematic cross-sectional view illustrating a sequence for etching a metal layer disposed on a substrate according to the method 200. Although the method 200 is described below with reference to a substrate having a metal layer utilized to form an interconnection structure, the method 200 may also be used to advantage in other transistor device manufacturing applications.

The method 200 begins at block 202 by transferring a substrate, such as the substrate 301, into a processing chamber, such as the processing chamber 100 in FIG. 1. The substrate 301 may be a silicon based material or any suitable insulating materials or conductive materials as needed, having a metal layer 304 disposed on the substrate 301 that may be utilized to form an interconnection structure 302 in the metal layer 304, as shown in FIG. 3A.

Figures 3A, 3B, 3C, 3D:
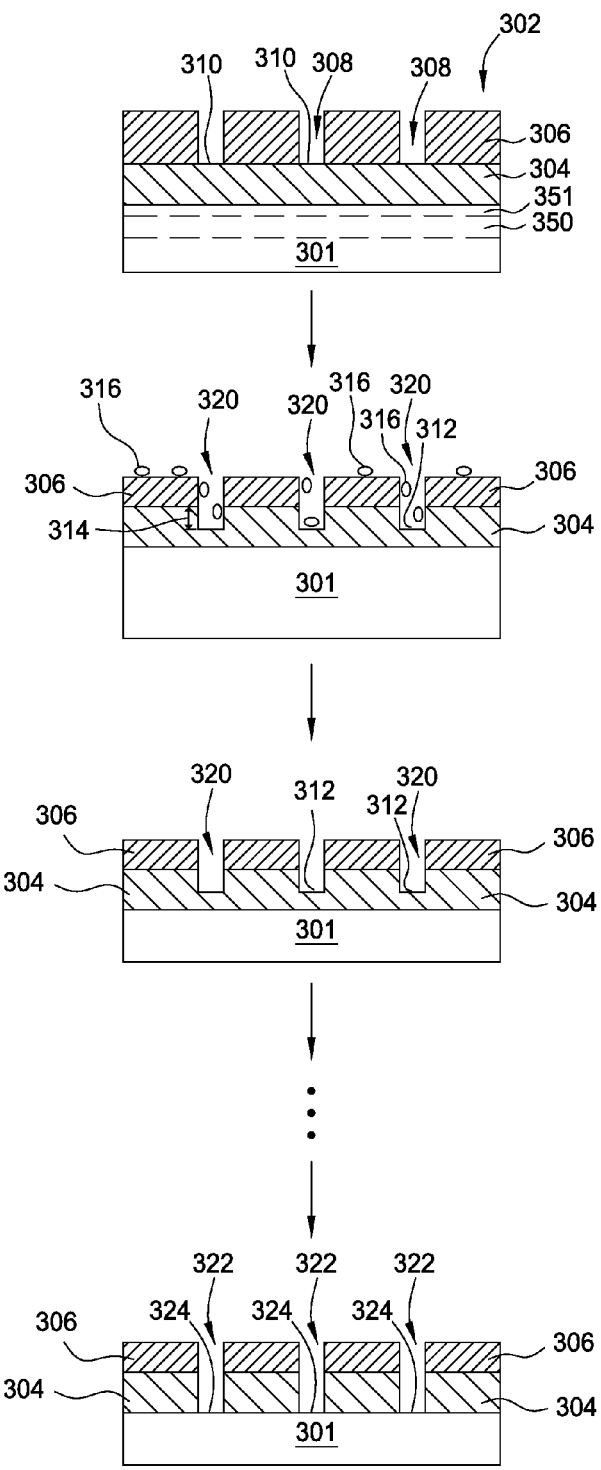
FIG. 3A-3D depict one embodiment of a sequence for patterning a metal layer to form features into the metal layer to manufacture an interconnection structure in accordance with the embodiment depicted in FIG. 2.

As shown in the exemplary embodiment depicted in FIG. 3A, the substrate 301 may have a substantially planar surface, an uneven surface, or a substantially planar surface having a structure formed thereon. In one embodiment, the substrate 301 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 301, the substrate 301 may include a buried dielectric layer disposed on a silicon crystalline substrate. In the embodiment depicted herein, the substrate 301 may be a crystalline silicon substrate.

In one particular embodiment, the substrate 301 may have a barrier layer 351 disposed between the metal layer 304 and a low-k insulating dielectric material 350, as shown in dotted line in FIG. 3A. It is noted that the barrier layer 351 and the low-k insulating material 350 are eliminated in the embodiments depicted in FIGS. 3B-3D for brevity and ease of explanation. The barrier layer 351 may be fabricated from TaN, TiN, AlN, TaSiN, TiSiN, or other suitable materials. Suitable examples of the low-k insulating dielectric material 351 includes SiO containing materials, SiN containing materials, SiOC containing materials, SiC containing materials, carbon based materials, or any other suitable materials.

In one embodiment, the metal layer 304 is disposed on the substrate 301. The metal layer 304 may be fabricated from tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others. In the embodiment depicted in FIGS. 3A-3D, the metal layer 304 is a copper layer or a copper alloy layer having a thickness between about 200 Å and about 500 Å, such as about 350 Å.

A patterned mask layer 306, a lithographically patterned mask or a hardmask layer, is then formed over the metal layer 304, exposing portions 310 of the metal layer 304 for etching. In one embodiment, the patterned mask layer 306 may is a positive tone photoresist, a negative tone photoresist, a UV lithography photoresist, an i-line photoresist, an e-beam resist (for example, a chemically amplified resist (CAR)) or other suitable photoresist. In one example, the patterned mask layer 306 may include organic polymer materials, such as fluoropolymers, silicon-containing polymers, hydroxy styrene, or acrylic acid monomers to provide acid groups when the mask layer 306 is exposed to radiation.

In another embodiment, the patterned mask layer 306 is a hardmask layer fabricated by a dielectric layer. The patterned mask layer 306 may be a single layer of dielectric material, composite layers of dielectric materials, or a film stack with different types of material including metal containing layer, dielectric materials and organic materials. Suitable examples of the patterned mask layer 306 include silicon oxide, silicon oxynitride, silicon carbide, amorphous carbon, silicon carbon-nitride (SiCN), TaN, Ta, TiN, or Ti and the like. In one embodiment, the patterned mask layer 306 is a layer of TaN, Ta, Ti or TiN.

At block 204, an etching gas mixture is supplied into the processing chamber 100 to etch the portions 310 of the metal layer 304 exposed by the patterned mask layer 306, as shown in FIG. 3B, until a predetermined first depth 314 of a feature 320 is formed in the metal layer 304. The patterned mask layer 306 servers as an etching mask during the etching process of the metal layer 304. The etching gas mixture is continuously supplied to etch the metal layer 304 until the depth 314 of the feature 320 are formed in the metal layer 304. In one embodiment, the depth 314 may be between about 50 Å and about 100 Å. Alternately, the depth 314 may be between about 10 percent and about 30 percent of the thickness of the metal layer 304.

During the etching process, etching by-product 316 may be adversely accumulated or adhered on surfaces of the patterned mask layer 306. Accordingly periodic cleaning process, which will be described later at block 206, is necessary to maintain cleanness of the substrate surface to continue etching the metal layer 304 with desired and accurate profile transfer and control.

In one embodiment, the etching gas mixture selected to etch the metal layer 304 includes at least a hydrocarbon containing gas having a formula $C_xH_y$, wherein x and y are integers ranging from 1 to 8 and 4 to 18 respectively. Suitable examples of the hydrocarbon containing gas include methane ($CH_4$), ethane ($C_2H_6$), propane ($C_3H_8$), butane ($C_4H_{10}$), pentane ($C_5H_{12}$), hexane ($C_6H_{14}$), propene, ethylene, propylene, butylene, pentene, combinations thereof and the like. In a particular embodiment, the hydrocarbon containing gas is methane ($CH_4$).

It is believed that a hydrocarbon containing gas may efficiently react with copper atoms from the metal layer 304, forming by-products, for example a hydro-carbon-copper complex 316, such as $CH_xCu_yH_z$ like compounds (x, y, z are integers) including $CH_3Cu$, $CHCu$, $CH_2Cu$ and/or other related compounds, in gas phase or in a solid matrix to be removed from the substrate surface. Copper surface atoms exposed to $CH_4$ plasma are excited into high energy state due to the energetic ions, electrons, and photon bombardment from the $CH_4$ plasma, forming the hydro-carbon-copper complex 316, such as $CH_xCu_yH_z$ like compounds (x, y, z are integers) including $CH_3Cu$, $CHCu$, $CH_2Cu$ and/or other related compounds, in a gas phase which readily pumps out of the processing chamber or in solid matrix which readily falls on the substrate surface or feature sidewalls While supplying the etching gas mixture, an inert gas may also be supplied into the etching gas mixture to assist the profile control as needed. Examples of the inert gas supplied in the gas mixture include Ar, He, Ne, Kr, Xe or the like.

In one embodiment, the hydrocarbon gas supplied in the etching gas mixture may be maintained at a flow rate by volume between about 5 sccm and about 100 sccm. The optional inert gas may be supplied to the processing chamber at a flow rate by volume between about 30 sccm and about 100 sccm.

After the etching gas mixture is supplied to the processing chamber mixture, RF source power is supplied to form a plasma from the etching gas mixture therein. The RF source power may be supplied between about 500 Watts and about 2000 Watts and at a frequency between about 400 kHz and about 13.56 MHz. A RF bias power may also be supplied as needed. The RF bias power may be supplied at between about 30 Watts and about 1000 Watts. In one embodiment, the RF source power may be pulsed with a duty cycle between about 10 to about 95 percent at a RF frequency between about 500 hz and about 10 kHz.

Several process parameters may also be controlled while supplying the etching gas mixture to perform the etching process. The pressure of the processing chamber may be controlled at between about 0.5 milliTorr and about 500 milliTorr, such as between about 4 milliTorr and about 30 milliTorr. A substrate temperature is maintained between about 15 degrees Celsius to about 300 degrees Celsius, such as greater than 50 degrees Celsius, for example between about 60 degrees Celsius and about 90 degrees Celsius. It is believed that high temperature, temperature greater than 50 degrees Celsius, helps reduce the amount of etching byproduct deposition on the substrate. The etching process may be performed for between about 10 seconds and about 30 seconds to etch the metal layer 304 with the depth 314 for between about 30 Å and about 100 Å. Alternatively, the etching process may remove between about 10 percent and about 30 percent of the thickness of the metal layer 304 from the substrate 301.

At block 206, an ashing process may be performed to remove by-products and/or other related compounds 316 from the substrate, as shown in FIG. 3C. During etching of the metal layer 304 at block 204, by-products, hydro-carbon-copper complex 316, such as $CH_xCu_yH_z$ like compounds (x, y, z are integers) including $CH_3Cu$, $CHCu$, $CH_2Cu$ and/or other related compounds, which are not formed in a gas phase that can be readily pumped out from the processing chamber, may become solid precipitate falling on the substrate surface. As the by-products and/or other related compounds 316 accumulates, the features 320 being formed in the metal layer 304 may be deformed and distorted. Accordingly, an ashing process may be performed to efficiently and timely remove the by-products and/or other related compounds 316 from the substrate surface.

In one embodiment, the ash process may be performed by supplying an ash processing gas mixture into the processing chamber. The ash process may be an isotropic etching process to remove the by-products and/or other related compounds 316 from the substrate 301.

In one embodiment, the ash gas mixture including at least one of a hydrogen containing gas and optionally an inert gas into the processing chamber to react with the by-products and/or other related compounds 316 from the substrate 301. The hydrogen containing gas and/or an inert gas supplied from the ash gas mixture forms carbon hydrogen gas or other carbon containing byproducts with the by-products and/or other related compounds 316 in gas phase to be pumped out of the chamber. In one embodiment, the hydrogen containing gas supplied in the ash gas mixture includes $H_2$ or $N_2$ and the inert gas supplied in the ash gas mixture includes He, Ar, and the like.

During the ash process, several process parameters may be regulated to control the ash process. In one exemplary embodiment, a process pressure in the vacuum processing chamber 100 is regulated between about 4 mTorr to about 50 mTorr, for example, at about 30 mTorr. A RF source power may be applied to 500 Watts to about 2000 Watts may be applied to maintain a plasma inside the vacuum processing chamber 100. Additional, a relatively low RF bias power less than 200 Watts may be utilized during the ashing process. The ash gas mixture may be flowed into the chamber at a rate between about 100 sccm to about 300 sccm. The ashing process may be performed for between about 10 seconds and about 120 seconds. A substrate temperature is maintained between about 15 degrees Celsius to about 300 degrees Celsius, such as greater than 50 degrees Celsius, for example between about 60 degrees Celsius and about 90 degrees Celsius. It is believed that high temperature, temperature greater than 50 degrees Celsius, helps reduce the amount of etching byproduct deposition on the substrate.

After the ashing process is performed, the by-products and/or other related compounds 316 presented on the substrate 301 may be then removed from the substrate 301. After the by-products and/or other related compounds 316 is removed from the substrate 301, a second cycle of the etching process at block 204 and the ashing process 206 may be performed to resume the etching process, as indicated by the loop 208.

At block 210, after the processes of the block 204 and 206 are repeatedly performed to form a desired feature 322 in the metal layer 304, exposing portions 324 of the substrate 301, as shown in FIG. 3D, the process 200 may then be terminated and completed. It is noted that the processes of the block 204 and 206 may be repeatedly performed as many times or in any number as needed until the metal layer 304 exposed by the patterned mask layer 306 is etched, forming the desired feature 322 in the metal layer 304. In one example, processes of the block 204 and 206 may be repeatedly performed for greater than about three times, such as between about 3 times and about 10 times.

After completion of the etching process, a wet clean process may be optionally performed to remove etching by-products remained on the substrate 301.

After the desired feature profile and/or the structure 322 of metal layer 304 is formed on the substrate 301, the part of the patterned mask layer 306 may be removed, leaving a portion of the mask layer 306 on the patterned metal layer 304 as a barrier layer for the subsequent interconnection manufacture process. In some embodiments, the remaining patterned mask layer 306 may be removed by ashing using oxygen containing gas. In the embodiment wherein the patterned mask layer 306 is consumed and used up during the etching process, the ashing or patterned mask layer 306 removal process may be eliminated as needed.

In the embodiment depicted in FIG. 3D, most of the patterned mask layer 306 is consumed during the etching process and only leaving a predetermined thickness of the patterned mask layer 306 remaining on the substrate for the subsequent interconnection process. In some cases, the patterned mask layer 306 is removed from the substrate after the metal layer etching process is completed.

Figure 4:
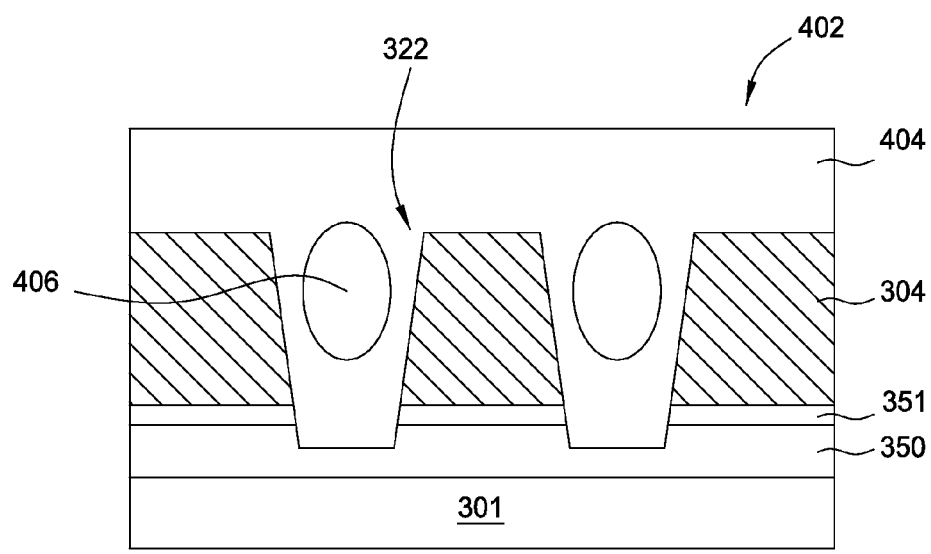
FIG. 4 depicts a cross sectional view of an interconnection structure utilizing the metal layer of FIG. 2 after the etching process.

After the features 322 are formed in the metal layer 304, insulating materials 404 may then fill into the features 322 formed in the metal layer 406 to form interconnection structure 402 as needed, as shown in FIG. 4. In this particular embodiment in FIG. 4, air gap 406 may be optionally formed in the features 322 defined in the metal layer 304 to increase capacitance as needed.

Thus, methods for etching a metal layer to form interconnection structure are provided. The etching process utilizes cyclic etching and ashing process to etch features in a metal layer with good feature/profile control. The methods may advantageously provide the etching process with good metal feature control and etching efficiency, thereby improving feature formation with desired dimension and profile formed in the metal layer disposed on a substrate in applications for interconnection structures of semiconductor chips.

While the foregoing is directed to embodiments of the present invention, other and further embodiments of the invention may be devised without departing from the basic scope thereof, and the scope thereof is determined by the claims that follow.

The invention claimed is:

1. A method of patterning a metal layer on a substrate, comprising:
   (a) supplying an etching gas mixture consisting essentially of a hydro-carbon gas into a processing chamber and removing between about 10 percent and about 30 percent of a thickness of a metal layer disposed on a substrate disposed in the processing chamber;
   (b) subsequently switching the etching gas mixture to an ashing gas mixture consisting of a hydrogen gas and an inert gas, the ashing gas mixture exposed to the metal layer exposed on the substrate for etching byproduct removal; and
   (c) repeatedly performing steps (a) and (b) until desired features are formed in the metal layer.

2. The method of claim 1, the metal layer is a copper layer.

3. The method of claim 1, wherein supplying the etching gas mixture further comprising:
   etching the metal layer to a depth between about 30 Å and about 100 Å.

4. The method of claim 1, wherein repeatedly performing steps (a) and (b) further comprises:
   repeatedly performing the steps (a) and (b) for at least about 3 times.

5. The method of claim 1, wherein the hydro-carbon gas is selected from a group consisting of methane ($CH_4$), ethane ($C_2H_6$), propane ($C_3H_8$), butane ($C_4H_{10}$), pentane ($C_5H_{12}$), hexane ($C_6H_{14}$), propene, ethylene, propylene, butylene, pentene and combinations thereof.

6. The method of claim 1, wherein the hydro-carbon gas is methane ($CH_4$).

7. The method of claim 1, wherein the etching byproduct is generated from the etching the metal layer.

8. The method of claim 1, wherein the etching byproduct includes hydro-carbon-copper complex compound.

9. The method of claim 1, wherein the substrate temperature is controlled at greater than 50 degrees Celsius.

10. A method of patterning a metal layer on a substrate, comprising:
  (a) performing an etching process comprising an etching gas mixture consisting essentially of a hydro-carbon gas on a metal layer disposed on a substrate in a processing chamber and removing between about 10 percent and about 30 percent of a thickness of the metal layer from the substrate;
  (b) subsequently switching the etching process to perform an ashing process comprising an ashing gas mixture consisting essentially of a hydrogen gas and an inert gas on the metal layer for etching byproducts removal; and
  (c) repeatedly performing steps (a) and (b) until desired features are formed in the metal layer.

11. The method of claim 10, wherein the hydro-carbon plasma is formed from an etching gas mixture including methane ($CH_4$).

12. The method of claim 10, wherein the hydrogen plasma is formed from an ashing gas mixture including $H_2$ gas.

13. The method of claim 10, wherein the metal layer is copper layer.

14. The method of claim 13, wherein the ashing process removes the etching byproducts including hydro-carbon-copper complex compound.

15. A method of patterning a metal layer on a substrate, comprising:
  supplying an etching gas mixture consisting essentially of methane ($CH_4$) to a processing chamber having a substrate disposed therein, the substrate having a metal layer disposed thereon;
  etching a portion of the metal layer from the substrate, wherein the portion of the metal layer is about 10 percent and about 30 percent of a thickness of the metal layer from the substrate;
  subsequently switching the etching gas mixture to an ashing gas mixture consisting essentially of a hydrogen gas, the ashing gas mixture exposed to the metal layer exposed on the substrate for etching byproducts removal;
  and
  cyclically supplying the etching gas mixture and the ashing gas mixture to the processing chamber for at least three times until desired features are formed in the metal layer.

16. The method of claim 15, wherein the metal layer is a copper layer.

* * * * *